(12) United States Patent
Gottwald

(10) Patent No.: US 6,180,009 B1
(45) Date of Patent: Jan. 30, 2001

(54) METHOD OF FILTERING THE ORGANIC SOLUTIONS ARISING IN THE PRODUCTION OF CIRCUIT BOARDS

(75) Inventor: Thomas Gottwald, Schramberg-Sulgen (DE)

(73) Assignee: Vantico Inc., Brewster, NY (US)

(*) Notice: Under 35 U.S.C. 154(b), the term of this patent shall be extended for 0 days.

(21) Appl. No.: 09/101,095

(22) PCT Filed: Jan. 9, 1997

(86) PCT No.: PCT/DE97/00022

§ 371 Date: Dec. 23, 1998

§ 102(e) Date: Dec. 23, 1998

(87) PCT Pub. No.: WO97/25127

PCT Pub. Date: Jul. 17, 1997

(30) Foreign Application Priority Data

Jan. 12, 1996 (DE) .............................................. 196 00 967

(51) Int. Cl.[7] .................................................... B01D 61/00
(52) U.S. Cl. ......................... 210/640; 210/651; 210/652; 210/805; 134/10; 134/12
(58) Field of Search .................................. 210/650, 651, 210/652, 806, 500.27, 805, 644, 640; 134/10, 12, 13; 203/47

(56) References Cited

U.S. PATENT DOCUMENTS

| 4,786,417 | 11/1988 | Miki et al. ........................... 210/639 |
| 4,788,043 | 11/1988 | Kagiyama et al. .................. 422/292 |
| 5,401,414 | 3/1995 | Wack et al. ........................... 210/651 |

FOREIGN PATENT DOCUMENTS

| 3143106 | 5/1983 | (DE) . |
| 4236713 | 5/1993 | (DE) . |
| 295 17 588 U | 3/1996 | (DE) . |
| 0521369 | 1/1993 | (EP) . |
| 0532199 | 3/1993 | (EP) . |
| 0608700 | 8/1994 | (EP) . |
| 2051664 | 1/1981 | (GB) . |

OTHER PUBLICATIONS

Derwent Abstr. 93–176800 for DE 4236713.
Oberfläche + JOT 1979, (7), pp. 355–360.
Chem. Abstr. 96:164887c.
Derwent Abstr. 85–051869.
M. Mulder, "Basic Principles of Membrane Technology", (1990).

*Primary Examiner*—W. L. Walker
*Assistant Examiner*—Richard W. Ward
(74) *Attorney, Agent, or Firm*—David R. Crichton; Michele A. Kovaleski

(57) ABSTRACT

The present invention relates to a process for fractionating organic circuit board manufacture process solutions by means of at least one very fine filtration step. In the process of the present invention, the dissolved substances present in the process solutions are separated, for example by ultrafiltration, from the organic process solvent, e.g., ethyidiglycol, to permit their respective reuse. The process of the present invention advantageously provides for considerable savings in terms of costs of material and energy and also for a considerable reduction in or even complete avoidance of waste.

8 Claims, 1 Drawing Sheet

Figure 1:
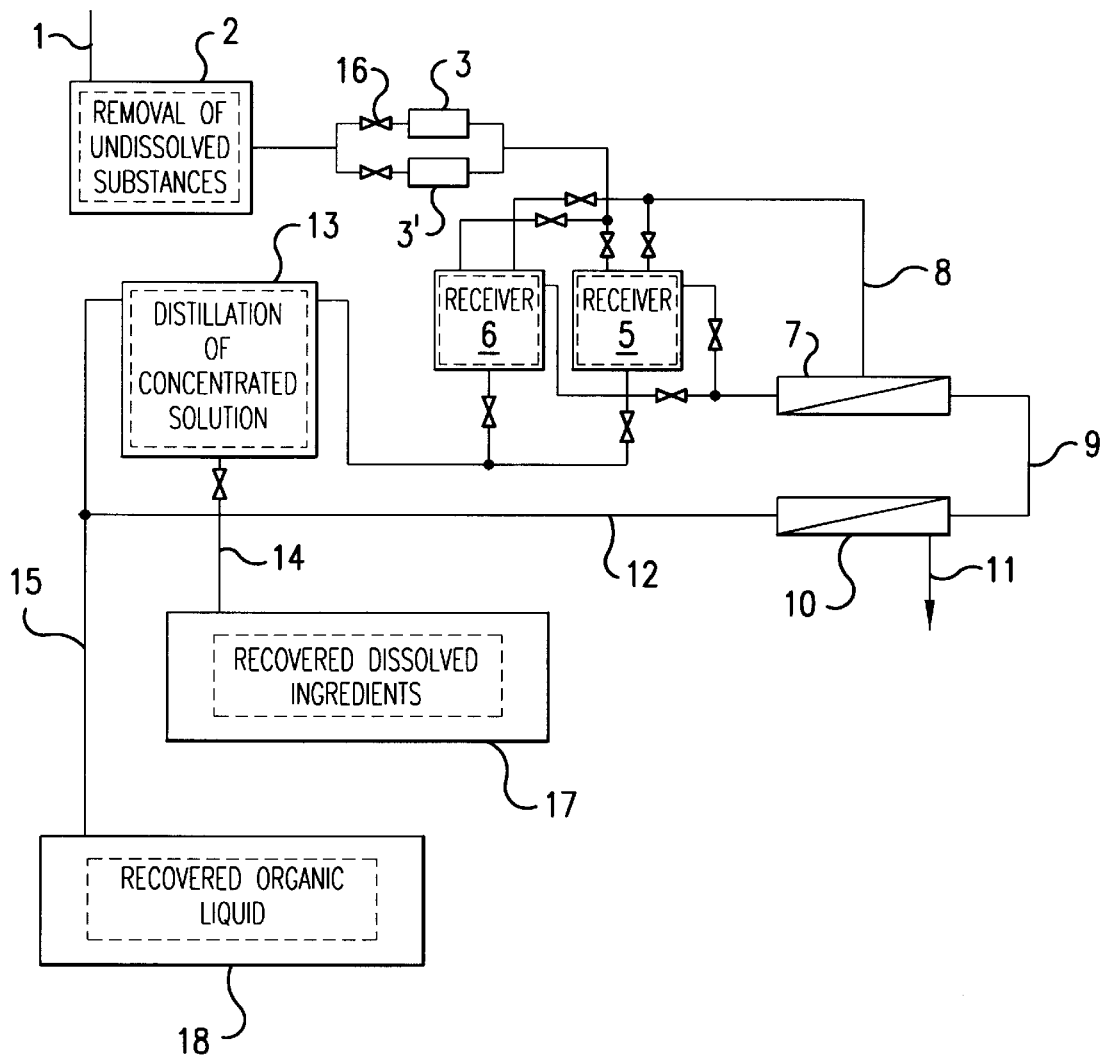

METHOD OF FILTERING THE ORGANIC SOLUTIONS ARISING IN THE PRODUCTION OF CIRCUIT BOARDS

The present invention relates to a process for fractionating organic circuit board manufacture process solutions as set forth in the preamble of claim 1.

Many manufacturing and processing operations give rise to solutions which, on the one hand, cannot be directly discharged into the sewage system on account of their composition or toxicity and, on the other, comprise valuable materials whose recovery or recycling is of economic interest. For instance, the film processing industry is constantly producing chemical-comprising treatment and wash solutions which have to be worked up prior to any disposal or recycling.

For instance, DE-A-42 36 713 describes a separation process for constituents dissolved in a liquid to clean a minimally contaminated wastewater, i.e., a liquid comprising low proportions of dissolved constituents, so as to convert the dissolved chemicals and also the solvent into a recyclable form. This is accomplished by alternating two membrane filters in a removal or cleaning stage, the first membrane filter being capable of removing the dissolved constituents under conditions of high throughput and low concentration and the second membrane filter being designed for low throughput and high concentration. This process is used for removing and recovering photochemicals from wastewaters of a photochemical treatment bath.

Other sectors likewise employ filtration processes for separating, concentrating and/or cleaning mixtures.

For instance, the article "Baustein der Weisen" in: Oberfläche+JOT 1979, No. 7, pages 355–360, describes various applications for ultrafiltration ranging in the main from the separation of oil/water emulsions to the recirculation of degreasing baths for water and chemical recovery.

Furthermore, EP-A-0 521 369 describes apparatus and a process for recovering glycol-based antifreezes by reverse osmosis, for example to remove ethylene glycol from a concentrated antifreeze solution.

No such process is known to date in the sector of the circuit board manufacturing industry or the semiconductor industry, where aggressive organic solvents are frequently used, too. These industries, however, likewise produce considerable volumes of solutions—especially organic solutions—which have to be either disposed of or recycled.

Hitherto, such process media or solutions were separated by distillation at high temperatures under reduced pressure. However, this requires a great deal of energy and an extensive investment in terms of equipment and safety technology, especially explosion protection measures. In such a conventional process, the distillation residue is a mixture of resins and fillers, which has to be disposed of or incinerated.

U.S. Pat. No. 4,786,417 describes an alternative disposal process. It comprises subjecting a solution containing water-soluble photoresist materials to an ultrafiltration, recycling the permeate from the ultrafiltration and exposing the removed photoresist material to electromagnetic radiation to polymerize the photoresist material for simpler disposal.

This process likewise has the disadvantage that it only recycles the solvent, which is water in the present case, whereas the dissolved and partly valuable organic substances are disposed of at relatively large expense.

It is therefore an object of the present invention to provide, specifically for the circuit board manufacturing sector, a process for fractionating process solutions and recycling a plurality of their constituents.

This object is achieved by the features of claim 1.

The process of the present invention provides for separation and reuse of individual constituents of organic circuit board manufacture process solutions into organic process solvent, water, dissolved substances and undissolved solids. In the process of the present invention, the separation of the solvent and of the substances dissolved therein is accomplished by very fine filtration.

The separation of the process of the present invention leads to at least two fractions, one fraction preferably comprising mainly solvent and a further fraction comprising mainly the substances dissolved therein. After separation, both the fractions can be at least partly reused.

The process of the present invention accordingly provides for at least partial recycling of the process solvent and of the substances dissolved therein.

In this connection, the process of the present invention has the advantage of requiring only relatively low capital costs and also of making it possible to achieve a high energy saving as compared with the earlier distillation process. This energy saving due to a reduction in the distillation requirement can be up to over 90%.

Furthermore, recycling of the solvent and of the substances dissolved therein provides for a distinct saving in the cost of material for circuit board manufacture.

Lastly, the process of the present invention makes it possible to reduce or even completely avoid circuit board manufacture waste, which likewise entails further possible cost savings for the otherwise necessary and also—owing to the aggressive solvents used in circuit board manufacture in some instances—costly disposal.

This last point is an important aspect, especially in the present day and age, where there is an increasing drive toward an ideally ecological and environmentally benign handling of chemicals.

The very fine filtration of the process of the present invention is advantageously a microfiltration, an ultrafiltration, a reverse osmosis or a pervaporation process. The choice among these processes will depend on the constituents of the particular process solution to be separated.

To increase the efficiency of the filtration, it can be sensible first to remove any solids or fillers present in the process solution. Such removal can be effected by filtration processes, sedimentation processes, the baffle plate method, centrifugation or other processes, especially those based on the difference in mass which is present.

Furthermore, as an additional step following the filtration, the concentrated retentate, comprising the dissolved substances and also solvent residues, can be distilled at low temperatures under reduced pressure to achieve further purification and more far-reaching recycling.

The distillation temperature should be below the temperature and time combination which is critical for curing, and temperatures of about 120° C. to about 160° C. are preferred. This also determines the level of the reduced pressure to be employed, which is preferably within the range from about 90,000 to about 50,000 Pa (about 900 to about 500 mbar).

Also, an additional step for removing water from the recovered solvent can be provided, and it can take the form of an ultrafiltration, a reverse osmosis or else a pervaporation process.

The additional removal of water has the advantage that the solvent can then be further used in the concentrated state or, in the case of a mixture, that it can be adjusted with greater accuracy.

In addition, the solvents used can be hygroscopic, which can then lead to a further accumulation of water. In such a case, the additional removal of water is particularly preferred.

The filtration is advantageously carried out using a membrane which is resistant to organic solvents. This is necessary especially in the case of aggressive organic solvents such as, for example, ethyldiglycol or methylpyrrolidone solutions. Furthermore, the membrane should have a suitable pore size, which depends on the process medium to be separated, in order that the separation of dissolved substances and solvent may be optimized as a result.

Such a membrane is preferably selected from the group consisting of organic, especially asymmetrical organic, polymer membranes, preferably those composed of polyvinylidene fluoride (PVDF), polypropylene (PP), polytetrafluoroethylene (PTFE) and/or polyethylene (PE), and inorganic membranes, especially ceramic or carbon membranes, and mineral-coated inorganic membranes.

The process of the present invention further provides for the advantageous possibility of recirculating the recovered constituents of the process solutions, making it possible to integrate the recovery process directly in the circuit board manufacturing process.

Examples of process solution which are used are ethyidiglycol-photoresist solutions from photoresist development; butyldiglycol-photoresist solutions from photoresist development; γ-butyrolactone-photoresist solutions from photoresist development; N-methylpyrrolidone-resist solutions; and mixtures from stripping processes and also other solvent-photoresist or solvent-resist solutions.

It is further possible to recover solvents from cleaning processes in which organic substances are dissolved in solvents and which are not directly related to the manufacture of circuit boards.

The organic process solution solvent intended for reuse is preferably selected from the group consisting of ethyidiglycol (EDG), diethylene glycol monoethyl ether (molecular weight 134.2 g/mol), butyldiglycol (BDG), diethylene glycol monobutyl ether (molecular weight 162.23 g/mol); γ-butyrolactone (GBL), dihydro-2(3H)-furanone (molecular weight 86.09 g/mol), N-methylpyrrolidone (NMP, molecular weight 99.1 g/mol), methoxypropyl acetate (MPA), propylene glycol methyl ether acetate (molecular weight 132 g/mol) and DY 950 (a product designation of Ciba-Geigy Ag, Basel, Switzerland, the product mentioned comprising γ-butyrolactone and further additives) and mixtures thereof.

However, it is also possible to use other solutions of coatings or organic substances in organic liquids where use of the process of the present invention is possible because of the differences in molecular or particle size.

Further advantages and features of the present invention will be apparent from the description of illustrative embodiments and from the drawing, where FIG. 1 shows a schematic of apparatus for carrying out the process of the present invention.

An embodiment of the present invention will now be described with reference to FIG. 1.

The organic process solutions to be separated are fed via a line 1 in a first step into a device 2 for removing undissolved solids or fillers, a sedimentation device in this case. The sedimentation step removes the bulk of the undissolved substances.

This is followed by a filtration through a prefilter 3 to remove the remainder of undissolved substances. In the event that prefilter 3 should be blinded, a second prefilter 3' is available for alternative use. The choice between prefilters 3 and 3' is made through activation of appropriate valves 16.

Thereafter the solids-free process solution, still comprising the solvent and the substances dissolved therein, passes into one of two receivers 5 or 6. Again the choice between these receivers 5 and 6 is controlled by means of valves. The solution then passes from the corresponding receivers into an ultrafiltration module 7 where the solution is separated by ultrafiltration.

Ultrafiltration effects a separation into a permeate, which comprises the solvent and is discharged via line 9, and a retentate, mainly comprising the concentrated dissolved substances and also residues of solvent. This retentate is then returned via a line 8 into one of the receivers 5 and 6.

The retentate can then be passed again into the ultrafiltration module 7, and the ultrafiltration can be repeated as often as desired.

It is likewise possible to dilute the retentate with new process solution, passed through prefilter 3 or 3' into receiver 5 or 6, prior to any renewed ultrafiltration.

Following adequate purification of the retentate comprising the dissolved substances, it is then passed from receiver 5 or 6 to a distillation device 13, where the remaining solvent is removed by distillation and the recovered dissolved substances are obtained. These are discharged via a line 14 and collected in a collection vessel 17 and are thus available for reuse. Alternatively, different fractions from the distillation can likewise be passed into different collection vessels, so that two or more dissolved substances can be separated from each or one another as well.

The solvent permeate obtained from the ultrafiltration is passed via a line 9 to a pervaporation module 10 where it is freed from the water present therein by pervaporation. The pervaporation permeate obtained, which is mainly water, is then discharged via a line 11.

The pervaporation retentate, comprising the dewatered solvent, is passed via a line 12 into a line 15, which passes into a collection vessel 18, where the recovered organic solvent is stored for reuse.

This collection vessel 18 likewise receives—again via line 15—the pure solvent obtained following distillation in the distillation device 13, together with the solvent obtained from the pervaporation process, ready for recycling.

There now follows a description of a specific illustrative embodiment:

To prepare solder resist covers, circuit boards are uniformly coated with photostructurable resist by curtain coating or by screen printing and dried. Structuring is by partial UV light irradiation, which causes the irradiated areas of the coating to polymerize while the nonirradiated areas do not react. The nonirradiated areas of the coating are soluble in the developer, whereas the irradiated areas are extremely insoluble and thus survive the development process intact.

In the development apparatus, a solvent is sprayed at a predetermined pressure and temperature onto the boards, causing the soluble areas to be washed off.

This gives rise to a mixture of the solvent—EDG—and photoresist in the development machine. Owing to the hygroscopy of the solvent, the EDG likewise accumulates water which becomes troublesome beyond a critical limit. The dried resist which passes into the solvent comprises a high molecular weight epoxy resin, fillers, e.g., talc, barium sulfate, residues of solvents such as methoxypropyl acetate and methoxypropanol, photoinitiators, sensitizers, dyes, thermal curing agent components and other substances which are largely trade secret.

The concentration of the resin component in the developer solution is mainly responsible for the development result.

The resin content of the solution, which is distilled in the prior art process, is about 3.5%. Consequently, to recover the solvent, about 95% of the mixture obtained has to be evaporated in order that 5% of contamination may be eliminated. And the atmospheric boiling point is above 200° C.

However, owing to the large difference in molecular weight between solvent and resin, separation by filtration methods is also possible.

The core of the process of the present invention here is an ultrafiltration module in which the two organic components—resin and solvent—are separated.

In order for this process to work reliably, the fillers present are first removed, since they could otherwise block the modules or cause abrasive wear of the modules. After removal has taken place, the recovered solvent is additionally at least partially stripped of water, so that no process variations in recycling are likely due to water uptake.

The concentrated resin solution, which has a resin content of at least about 30%, can then be subjected to a distillation for further concentrating. After the resin obtained has been worked up, it can normally be reused.

This measure dramatically reduces or even completely eliminates the energy- and cost-intensive distillation process.

The process of the present invention can in principle be used for all solvent-developable resist systems. Similarly, the process can also be used for regenerating stripping solutions. These are used to get all the resist back off defectively irradiated boards. Basically the same apparatus is used, but with other solvents, e.g., N-methylpyrrolidone (NMP), in which the irradiated resist is at least partly soluble.

What is claimed is:

1. A process for separating an organic circuit board manufacture process solution comprising at least one organic solvent, water and dissolved substances into at least two fractions for at least partial reuse, in which a solution comprising undissolved solids is subjected to solids removal before being separated into at least two fractions, characterized in that ultrafiltration or reverse osmosis is used to effect a first separation into a first fraction, which mainly comprises the organic solvent, and a second fraction, which comprises the dissolved substances, and the first fraction obtained is subjected to a separating step in the form of ultrafiltration, reverse osmosis or pervaporation to remove water from said first fraction comprising the recovered process solvent, and wherein the concentrated second fraction from the first separation is subjected to a distillation at a temperature of between about 120° C. to about 160° C. and a pressure of from about 90,000 to about 50,000 Pa.

2. A process according to claim 1, characterized in that the first separation is carried out using a membrane which is resistant to the constituents of the process solution and is selected from the group consisting of an organic polymer membrane and an inorganic membrane.

3. A process according to claim 2, wherein the organic polymer membrane is composed of polyvinylidene fluoride (PVDF), polypropylene (PP), polytetrafluoroethylene (PTFE) and/or polyethylene (PE).

4. A process according to claim 2, wherein the inorganic membrane is composed of a ceramic or carbon membrane or mineral-coated inorganic membrane.

5. A process according to claim 1, characterized in that the organic process solution is separated into the following fractions: organic solvent, substances dissolved therein and solid constituents.

6. A process according to claim 1, characterized in that the first and second fractions are recirculated.

7. A process according to claim 1, characterized in that the process solution is selected from the group consisting of:
   (a) ethyidiglycol-photoresist solutions from photoresist development;
   (b) butyldiglycol-photoresist solutions from photoresist development;
   (c) γ-butyrolactone-photoresist solutions from photoresist development;
   (d) N-methylpyrrolidone resist solutions; and
   (e) mixtures from stripping processes.

8. A process according to claim 1, characterized in that the solvent of the process solution is selected from the group consisting of:
   ethyldiglycol, diethylene glycol monoethyl ether, butyldiglycol, diethylene glycol monobutyl ether, γ-butyrolactone, N-methylpyrrolidone, methoxypropyl acetate and propylene glycol methyl ether acetate and mixtures thereof.

* * * * *